US008062536B2

(12) United States Patent
Liu et al.

(10) Patent No.: US 8,062,536 B2
(45) Date of Patent: *Nov. 22, 2011

(54) HIGH DENSITY PLASMA CHEMICAL VAPOR DEPOSITION PROCESS

(75) Inventors: Chih-Chien Liu, Hsin-Chu (TW); Ta-Shan Tseng, Hsin-Chu (TW); Wen-Bin Shieh, Hsin-Chu (TW); Juan-Yuan Wu, Hsin-Chu (TW); Water Lur, Hsin-Chu (TW); Shih-Wei Sun, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/729,234

(22) Filed: Mar. 22, 2010

(65) Prior Publication Data

US 2010/0173490 A1    Jul. 8, 2010

Related U.S. Application Data

(63) Continuation of application No. 09/991,196, filed on Nov. 20, 2001, now Pat. No. 7,718,079, which is a continuation of application No. 09/546,174, filed on Apr. 11, 2000, now Pat. No. 7,514,014, which is a continuation of application No. 08/958,460, filed on Oct. 28, 1997, now Pat. No. 6,117,345.

(60) Provisional application No. 60/041,790, filed on Apr. 2, 1997.

(51) Int. Cl.
*H01L 21/467* (2006.01)
*H01L 21/32* (2006.01)
*H01L 21/308* (2006.01)
*H01L 21/762* (2006.01)

(52) U.S. Cl. ............... 216/19; 216/67; 216/75; 216/79; 216/80; 438/695; 438/710

(58) Field of Classification Search .................... 216/19, 216/67, 75, 79, 80; 438/695, 710
See application file for complete search history.

(56) References Cited

U.S. PATENT DOCUMENTS

| 4,172,005 | A |   | 10/1979 | Muraoka |   |
|---|---|---|---|---|---|
| 4,491,628 | A |   | 1/1985 | Ito |   |
| 4,820,611 | A |   | 4/1989 | Arnold, III |   |
| 5,127,989 | A |   | 7/1992 | Haraguchi |   |
| 5,219,788 | A |   | 6/1993 | Abernathey |   |
| 5,316,640 | A |   | 5/1994 | Wakabayashi |   |
| 5,378,659 | A |   | 1/1995 | Roman |   |
| 5,494,854 | A |   | 2/1996 | Jain |   |
| 5,580,701 | A |   | 12/1996 | Lur |   |
| 5,604,696 | A | * | 2/1997 | Takaishi | .................. 365/149 |
| 5,656,543 | A |   | 8/1997 | Chung |   |
| 5,700,737 | A |   | 12/1997 | Yu |   |
| 5,730,803 | A |   | 3/1998 | Steger |   |
| 5,737,388 | A |   | 4/1998 | Kossila |   |
| 5,759,746 | A |   | 6/1998 | Azuma |   |
| 5,759,916 | A |   | 6/1998 | Hsu |   |
| 5,780,323 | A |   | 7/1998 | Forouhi |   |
| 5,843,836 | A |   | 12/1998 | Cheung |   |
| 5,851,899 | A |   | 12/1998 | Weigand |   |
| 5,854,126 | A | * | 12/1998 | Tobben et al. | ................ 438/626 |
| 5,858,869 | A |   | 1/1999 | Chen |   |
| 5,885,894 | A |   | 3/1999 | Wu |   |
| 5,913,140 | A |   | 6/1999 | Roche |   |
| 5,918,147 | A |   | 6/1999 | Filipiak |   |
| 5,968,610 | A | * | 10/1999 | Liu et al. | ......................... 438/435 |
| 6,117,345 | A | * | 9/2000 | Liu et al. | .......................... 216/19 |
| 6,203,863 | B1 | * | 3/2001 | Liu et al. | ......................... 427/579 |
| 7,078,346 | B2 | * | 7/2006 | Liu et al. | ......................... 438/695 |
| 7,271,101 | B2 | * | 9/2007 | Liu et al. | ......................... 438/695 |
| 7,514,014 | B1 | * | 4/2009 | Liu et al. | .......................... 216/19 |
| 7,718,079 | B2 | * | 5/2010 | Liu et al. | .......................... 216/19 |
| 2002/0030033 | A1 |   | 3/2002 | Liu |   |

FOREIGN PATENT DOCUMENTS

JP    8-288285    * 11/1996
JP    8288285        11/1996

OTHER PUBLICATIONS

Nov. 8, 2001—Public Testimony of Water Lur (cont.) and Richard Fair.
Nov. 9, 2001—Public Testimony of Richard Fair (cont.).
Nov. 13, 2001—Public Testimony of Chih-Chien Liu.
Nov. 14, 2001—Public Testimony of Douglas Peltzer.
Nov. 15, 2001—Public Testimony of Douglas Peltzer (cont.) and Richard Fair (cont.).
Dec. 10, 2001—Public Testimony of Richard Fair (cont.).
Dec. 12, 2001—Public Testimony of Douglas Peltzer (cont.) and Richard Fair (cont.). United States International Trade Commission, Confidential, Complainants Rebuttal Expert Report, In the Matter of Certain Integrated Circuits, Processes for Making Same, and Products Containing Same, Investigation No. 337-TA-450, entered Oct. 1, 2001.
United States International Trade Commission, Confidential, Respondents Rebuttal Expert Report and Rebuttal Tests, In the Matter of Certain Integrated Circuits, Processes for Making the Same, and Products Containing Same, Investigation No. 337-TA-450, Oct. 1, 2001.
United States International Trade Commission, Respondents' Identificiation of Prior Art, In the Matter of Certain Integrated Circuits, Processes for Making Same, and Products Containing Same, Investigation No. 337-TA-450, dated Sep. 21, 2001.
J.T.Pye, et al., "High-Density Plasma CVD and CMP for 0.25-μm Intermetal Dielectric Processing," Solid State Technology, Dec. 1995, pp. 65-69.
J.T. Pan, et al."Integrated Interconnect Module Development," VMIC, 1996 ISMIC, Jun. 18-20, 1996, pp. 46-51.

(Continued)

*Primary Examiner* — Rabon Sergent
(74) *Attorney, Agent, or Firm* — Winston Hsu; Scott Margo

(57) ABSTRACT

A method for depositing dielectric material into gaps between wiring lines in the formation of a semiconductor device includes the formation of a cap layer and the formation of gaps into which high density plasma chemical vapor deposition (HDPCVD) dielectric material is deposited. First and second antireflective coatings may be formed on the wiring line layer, the first and second antireflective coatings being made from different materials. Both antireflective coatings and the wiring line layer are etched through to form wiring lines separated by gaps. The gaps between wiring lines may be filled using high density plasma chemical vapor deposition.

12 Claims, 4 Drawing Sheets

OTHER PUBLICATIONS

S.Nag, et al. "Integration of ICP High-Density Plasma Inter-Level Dielectric Films Into a 0.35μ.m. CMOS Five-Level Interconnect System," Jun. 27-29, 1995 VMIC Conference, 1995 ISMIC, pp. 24-30.

Jiro Yota, et al. "Integration of ICP High-Density Plasma CVD with CMP and its Effects on Planarity for Sub-0.5 μ. m. CMOS Technologh," SPIE vol. 2875, pp. 265-274.

Haruyoshi Yagi, "Multilevel Interconnection technology in system LSI,".

Toshihiko Tanaka, "A novel antireflectIon method with gradient photoabsorption for optical lithography," SPIE vol. 2726, pp. 573-582.

PSE Technical Conference, Las Vegas, Apr. 14-19, 1996, Applied Materials, Inc.

Seung Gol Lee, et al. "Optimal design of antireflective layer for DUV lithography and their experimental results," SPIE vol. 3049, pp. 409-418.

Stephan E. Lassig, et al. "Gap Fill Using High Density Plasma CVD," Feb. 21-22, 1995 DUMIC Conference, 1995 ISMIC, pp. 190-196.

G. Gagnon, et al. "Effect of a TiN anti-reflecting coating on the performance of Ti/TiN/AISICu metallization of VLSI devices," Jun. 18-20, 1996 VMIC Conference, 1996 ISMIC, pp. 527-529.

B. Fowler, et al. "Relationships between the material properties of silicon oxide films deposited by electron cyclotron resonance chemical vapor deposition and their use as an indicator of the dielectric constant," J. Vac. Sci. Technol. B 12(1), Jan./Feb. 1994, pp. 441-448.

Han J. Dijkstra, et al. Optimization of Anti-Reflection Layers for Deep UV Lithography, SPIE vol. 1927 (1993), pp. 275-286.

"CVD/CMP 0.25μ.m and Beyond Technology Seminar," Apr. 30, 1996, Technology Seminar, Applied Materials Taiwan.

David Cheung, et al. "Plasma Silence Technology, Dielectric CVD I," NARA CVD Product Training, May 1996, Applied Materials, Inc.

S. Logothetidis, et al. "Room temperature oxidation behavior of TiN thin films," Thin Solid Films, Elsevier Science S.A. 1999, pp. 304-313.

A. Bendavid, et al. "Deposition and modification of titanium dioxide thin films by filtered arc deposition," Thin Solid Films, Elsevier Science S.A. 2000, pp. 241-249.

S. A. Campbell, et al. "Titanium dioxide (TiO2)-based gate insulators," IBM Journal of Research and Development, vol. 43, No. 3, May, 1999, pp. 383-391.

S. Gwo, et al. "Local electric-field-induced oxidation of titanium nitride films," American Institute of Physics, Applied Physics Letters, vol. 74, No. 8, Feb. 22, 1999, pp. 1090-1092.

T. Bacci, et al. "Microstructural Analysis and Crystallographic Characterisation of Plasma Oxynitrided Ti-6AI-4V," IoM Communications Ltd. 2000, pp. 37-42.

Fu-Hsing Lu, et al. "XPS analysis of TiN films on Cu substrates after annealing in the controlled atmosphere," Thin Solid Films, Elsevier Science S.A. 1999, pp. 374-379.

Stanley Wolf, Ph.D., et al. "Silicon Processing for the VLSI Era vol. 1: Process Technology," Lattice Press, California, 1986, pp. 371-373.

Harland G. Tompkins, et al. "Oxidation of TiN in an oxygen plasma asher," Journal of Vacuum Science and Technology, vol. 12. Issue 4, Jul./Aug. 1994, pp. 2446-2450.

Hiroshi Kubota, et al. "Oxidation of TiN thin films in an ion-beam-assisted deposition process," Elsevier, Applied Surface Science 82/83 (1994) pp. 565-568.

Christopher Bancher, et al. "Dielectric antireflective coatings for DUV lithography," Solid State Technology, vol. 1, No. 3, Mar. 1, 1997 pp. 109-114.

Tohru Ogawa, et al. "SiOxNy:H, high performance anti-reflective layer for the current and future optical lithography," LSI Basic Process Technology Division, ULSI R&D Laboratories, SONY Corporation. SPIE vol. 2197, Jan. 1994 pp. 722-732.

Kim R. Dean, et al. "Investigation of deep ultraviolet photoresists on TiN substrates," SEMATECH, Austin, Texas, SPIE vol. 2438, Jun. 1995 pp. 514-528.

Qizhi He, et al. "Investigating Positive DUV Resist Profile on TiN," Semiconductor Process and Device Center, Texas Instruments, Dallas, TX, SPIE vol. 3049, 1997, pp. 988-996.

United States International Trade Commission, Public Version, Initial Determination, Administrative Law Judge Sidney Harris, In the Matter of Certain Integrated Circuits, Processes for Making Same, and Products Containing Same, Investigation No. 337-TA-450, May 6, 2002.

United States International Trade Commission, Public Version, Order and Commission Opinion, In the Matter of Certain Integrated Circuits, Processes for Making Same, and Products Containing Same, Investigation No. 337-TA-450, Jan. 7, 2003.

United States International Trade Commission, Confidential, Complainants' Petition for Review of the May 6, 2002 Initial Determination and Order, In the Matter of Certain Integrated Circuits, Processes for Making Same, and Products Containing Same, Investigation No. 337-TA-450, dated May 17, 2002.

United States International Trade Commission, Confidential, Office of Unfair Import Investigations' Petition for Review of Portions of the Initial Determination, In the Matter of Certain Integrated Circuits, Processes for Making Same, and Products Containing Same, Investigation No. 337-TA-450, dated May 17, 2002.

United States International Trade Commission, Confidential, Contingent Petition of Respondents Silicon Integrated Systems Corp. and Silicon Integrated Systems Corporation for Review of the Intial Determination, Investigation No. 337-TA-450, dated May 17, 2002.

United States International Trade Commission, Confidential, Respondents' Response to Petitions for Review of the May 6, 2002 Initial Determination and Order, In the Matter of Certain Integrated Circuits, Processes for Making Same, and Rpoducts Containing Same, Investigation No. 337-TA-450, dated May 24, 2002.

United States International Trade Commission, Confidential, Complainants' Response to Respondents' Contingent Petition for Review of the May 6, 2002 Initial Determination and Order, In the Matter of Certain Integrated Circuits, Processes for Making Same, and Products Containing Same, Investigation No. 337-TA-450, dated May 24, 2002.

United States International Trade Commission, Confidential, The Office of Unfair Import Investigations' Response to Complainants' and Respondents' Petitions for Review of the Final Initial Determination, In the Matter of Certain Integrated Circuits, Processes for Making Same, and Products Containing Same, Investigation No. 337-TA-450, dated May 24, 2002.

United States International Trade Commission, Confidential, Prehearing Statement of Silicon Integrated Systems Corporation (Taiwain) and Silicon Integrated Systems Corporation (California), Exhibit A: Expert Report of Harry F. Manbeck; Exhibit B: Expert Report of Douglas L. Peltzer, In the Matter of Certain Integrated Circuits, Processes for Making Same, and Products Containing Same, Investigation No, 337-TA-450, dated Oct. 26, 2001, with Exhibits A-C.

United States International Trade Commission, Confidential, Pre-Hearing Statement of the Commission Investigative Staff, In the Matter of Certain Integrated Circuits, Processes for Making Same, and Products Containing Same, Investigation No. 337-TA-450, dated Nov. 2, 2001.

United States International Trade Commission, Confidential, Complainants' Prehearing Statement for Hearing Commencing Nov. 7, 2001, In the Matter of Certain Integrated Circuits, Processes for Making Same, and Products Containing Same, Investigation No. 337-TA-450, dated Oct. 26, 2001.

United States International Trade Commission, Confidential, Complainants' Brief on Questions Posed and Issues Identified for Review in Jun. 21 Notice of Commission Decision to Review Portions of Initial Determination, In the Matter of Certain Integrated Circuits, Processes for Making Same, and Products Containing Same, Investigation No. 337-TA-450, dated Jul. 9, 2002 including Exhibit 388 (duplicate).

United States International Trade Commission, Confidential, Office of Unfair Import Investigations' Brief on the Issues Under Review and on Remedy, The Public Interest, and Bonding, In the Matter of Certain Integrated Circuits, Processes for Making Same, and Products Containing Same, Investigation No. 337-TA-450, dated Jul. 9, 2002 (duplicate).

United States International Trade Commission, Confidential, Complainants' Rebuttal Expert Report, In the Matter of Certain Integrated Circuits, Processes for Making Same, and Products Containing Same, Investigation No. 337-TA-450, dated Oct. 1, 2001.

United States International Trade Commission, Confidential, Respondents' Brief on Commission's Jun. 21, 2002 Decision to Review the May 6, 2002 Initial Determination, In the Matter of Certain Integrated Circuits, Processes for Making Same, and Products Containing Same, Investigation No. 337-TA-450, dated Jul. 9, 2002, including Exhibits A-E and 391. (duplicate).

United States International Trade Commission, Confidential, Respondents' Reply Brief on Commission's Jun. 21, 2002 Decision to Review the May 6, 2002 Initial Determination, In the Matter of Certain Integrated Circuits, Processes for Making Same, and Products Containing Same, Investigation No. 337-TA-450, dated Jul. 16, 2002, including Exhibits A and B.

Report of Professor Richard B. Fair, Ph.D., In re Certain Integrated Circuits, Processes for Making Same, and Products Containing Same, ITC Investigation No. 337-TA-450, Sep. 19, 2001, including Exhibits 173, A-Q, and 1-7, B1C.

United States International Trade Commission, Confidential, The Office of Unfair Import Investigations' Response to Complainants' and Respondents' Briefs on the Issues Under Reviewand on Remedy, the Public Interest, and Bonding, In the Matter of Certain Integrated Circuits, Processes for Making Same, and Products Containing Same, Investigation No. 337-TA-450, dated Jul. 16, 2002.

United States International Trade Commission, Confidential, Complainants' Reply Brief on Questions Posed and Issues Identified for Review in Jun. 21 Notice of Commission Decision to Review Portions of Initial Determination, In the Matter of Certain Integrated Circuits, Processes for Making Same, and Products Containing Same, Investigation No. 337-TA-450, dated Jul. 16, 2002.

Nov. 5, 2001—Tutorial (Richard Fair and Douglas Peltzer).

Nov. 7, 2001—Public Testimony of Water Lur.

* cited by examiner

HIGH DENSITY PLASMA CHEMICAL VAPOR DEPOSITION PROCESS

CROSS REFERENCE TO RELATED APPLICATIONS

This is a continuation application of U.S. patent application Ser. No. 09/991,196 filed on Nov. 20, 2001 (now issued as U.S. Pat. No. 7,718,079), which is a continuation application of U.S. patent application Ser. No. 09/546,174 filed on Apr. 11, 2000 (now issued as U.S. Pat. No. 7,514,014), which is a continuation application of U.S. patent application Ser. No. 08/958,460 filed on Oct. 28, 1997 (now issued as U.S. Pat. No. 6,117,345), which claims the benefit of provisional application Ser. No. 60/041,790 filed on Apr. 2, 1997, and all benefits of such earlier application are hereby claimed for this new continuation application.

BACKGROUND OF THE INVENTION

1. Field of the Invention

The present invention relates to a process for forming conductive regions such as wiring lines and for filling the gaps between conductive regions in a semiconductor circuit with a dielectric material using high density plasma chemical vapor deposition.

2. Description of the Prior Art

Many highly integrated semiconductor circuits utilize multilevel wiring line structures for interconnecting regions within devices and for interconnecting one or more devices within the integrated circuits. In forming such structures, it is conventional to provide first or lower level wiring lines or interconnect structures and then to form a second level wiring line in contact with the first level wiring lines or interconnect structures. A first level interconnect might be formed in contact with a doped region within the substrate of an integrated circuit device. Alternately, a first level interconnect might be formed to a polysilicon or metal wiring line that is in contact with one or more device structures in or on the substrate of the integrated circuit device. One or more interconnections are typically formed between the first level wiring line or interconnect and other portions of the integrated circuit device or to structures external to the integrated circuit device. This is accomplished, in part, through the second level of wiring lines.

Most often, the wiring lines of the multilevel interconnect structure are formed by conventional photolithographic techniques. For example, devices such as FETs, diodes or transistors are formed in and on the substrate to form an integrated circuit device and a first level of insulating material is deposited over the device. A pattern of contact holes is defined through the first level of insulating material and, at some point in the process, the contact holes are filled with a conducting material to define vertical interconnects through the first level of insulating material to contact points of the appropriate ones of the devices on the surface of the substrate. A first metal layer that will be patterned to form a first level of wiring lines is provided on the first level of insulating material and over the surface of the device. An etch mask is formed on the surface of the first metal layer that defines a pattern of wiring lines to connect to various ones of the vertical interconnects. Generally, the etch mask is formed by providing a layer of photoresist on the surface of the first metal layer, exposing the layer of photoresist through an exposure mask and developing the photoresist to form the etch mask. Etching processes remove those portions of the first metal layer exposed by the etch mask, leaving behind the desired pattern of wiring lines.

Reduced design rules for forming integrated circuit devices have necessitated the use of photolithography steppers that use short wavelength exposure sources. Such short wavelength exposure sources allow for finer resolution lithography, but have the drawback of much higher levels of reflection from different components of the integrated circuit device. For example, during exposure of the photoresist mask, it is possible that light may pass entirely through the photoresist and reflect from the surface of the first metal layer back into the lower portions of the photoresist layer. To the extent that the reflected light is scattered by the surface of the first metal layer, it is possible that unwanted portions of the photoresist layer might be exposed. These unwanted reflections could undesirably narrow the first level metal wiring lines formed in this process.

It is desirable for the wiring lines and gaps between the wiring lines to be formed as accurately as possible. Misalignment or improper thickness of the developed photoresist protective layer may cause light to be reflected from the surface of a metal layer back up to the photoresist layer, exposing portions of the photoresist layer that are intended to not be exposed. Such additional exposure from light reflecting from the underlying metal layer may cause the developed portion of the photoresist layer to have a larger width than intended, which means that a narrower than intended surface area will be etched and the wiring lines may be too close together, leading to undesirable capacitive coupling or even shorting between lines. In addition, light reflected from the underlying metal layer may cause portions of the photoresist layer to be thinner than intended, which may result in the thinner portions being etched through and the underlying metal layer, which should be protected by the photoresist, will be partially etched. Such partial etching may form voids in the wiring lines and lead to decreased device performance and/or failure. The use of photoresist masks can also lead to contamination from the photoresist, such as carbon compounds, being deposited in the gaps between wiring lines or on the wiring lines and forming defects that interfere with processing and ultimately hinder device performance.

As devices are scaled to smaller geometries, the gaps formed between wiring lines generally have high aspect ratios (ratio of height to width) which are harder to fill with dielectric material than small aspect ratio gaps. In addition, as the distance between wiring lines and other conductors becomes smaller, capacitive coupling between wiring lines and other conductors becomes a limitation on the speed of the integrated circuit device. For adequate device performance in reduced dimension devices, it is necessary that the lithography and etching steps be accurately carried out to ensure proper location and sizing of the wiring lines and gaps. It is also necessary that the dielectric material subsequently deposited into the gaps between wiring lines meet a number of requirements. The dielectric material should be able to completely fill the gap between conductors and should be planarizable so that successive layers can be deposited and processed. The dielectric material should also be resistant to moisture transport and have a predictable and low dielectric constant to minimize capacitance between adjacent wiring lines and between wiring lines on different layers.

It is thus important to accurately form the wiring lines and gaps, and to deposit a high quality, substantially void-free dielectric into the gaps. Dielectric layers for wiring line isolation are often formed by chemical vapor deposition (CVD) processes, which deposit material onto a surface by transporting certain gaseous precursors to the surface and causing the precursors to react at the surface. Common CVD methods include atmospheric-pressure CVD (APCVD), low-pressure CVD (LPCVD) and plasma-enhanced CVD (PECVD). High quality APCVD and LPCVD oxides may be deposited at high temperatures (650-850° C.), but such temperatures are generally not compatible with preferred wiring materials such as aluminum. Lower temperature APCVD and LPCVD processes tend to yield oxides that are comparatively more porous and water absorbing and that may be poorly suited to use as intermetal dielectrics. Acceptable oxides may be formed using PECVD processes, which use a plasma to impart additional energy to the reactant gases. The additional energy supplied by the plasma enables PECVD processes to be carried out at lower temperatures (approximately 400° C. and less) than APCVD or LPCVD processes.

One known method for depositing dielectric material between wiring lines forms a sandwich of a layer of silane-based or TEOS-based oxide deposited by PECVD together with a layer of spin-on-glass provided in the gaps and over the wiring lines. Another method deposits only a TEOS-based dielectric layer into the gaps and over the wiring lines. Problems relating to moisture absorption, spin-on-glass outgassing and incomplete gap fill in small geometries are observed and are likely to become more problematic for further reductions in device size. Thus, it would be desirable to provide a method for filling small geometry, high aspect-ratio gaps with a dense, high quality dielectric material.

SUMMARY OF THE INVENTION

One aspect of the present invention provides a method of making a semiconductor device isolation structure in which a high density plasma chemical vapor deposition (HDPCVD) process is utilized. Preferably, the deposition process is controlled to both optimize gap filling speed and to protect structures on the device from etching carried out during the deposition process or in other processes.

Certain embodiments of the present invention include a method for forming over a substrate wiring line structures separated by gaps. The method includes providing a substrate and a wiring line layer above the substrate. A first antireflective coating is formed on the wiring line layer. A second antireflective coating is formed on the first antireflective coating, wherein the first antireflective coating and the second antireflective coating are formed from different materials. Portions of the first antireflective coating, the second antireflective coating, and the wiring line layer are etched to form wiring lines separated by gaps, and a dielectric material is deposited within the gaps between the wiring lines.

Embodiments of the present invention also include a method for forming conducting structures separated by gaps on a substrate. The method includes providing a substrate and a wiring line layer above the substrate. A cap layer is formed above the wiring line layer. A portion of the cap layer and a portion of the wiring line layer are etched through to form wiring lines separated by gaps, the wiring lines having a remaining portion of the cap layer thereon. A dielectric material is deposited within the gaps using high density plasma chemical vapor deposition at a sputtering rate sufficient to fill the gaps.

Additional embodiments also include a method for forming conducting structures separated by gaps filled with dielectric material. A surface layer is formed over a surface of a silicon substrate, the surface layer comprising at least one material selected from the group consisting of titanium nitride, titanium silicide and a titanium-tungsten alloy. A metal wiring layer is formed on the surface layer, the metal wiring layer having an upper surface. A protective layer having a top surface is formed on the upper surface of the metal wiring layer, the protective layer comprising at least one material selected from the group consisting of titanium nitride, titanium silicide and a titanium-tungsten alloy. A cap layer is formed on the top surface of the protective layer, the cap layer comprising at least one material selected from the group consisting of an oxide, a nitride, and an oxynitride. A patterned photoresist layer is formed above the cap layer, the patterned photoresist layer covering selected portions of the cap layer and exposing other portions of the cap layer. Exposed portions of the cap layer, the protective layer, and the metal layer are etched to form wiring lines separated by gaps. A layer of high density plasma chemical vapor deposition dielectric material is formed within the gaps.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Embodiments of the invention are described with reference to the accompanying drawings which, for illustrative purposes, are schematic and are not drawn to scale, where.

DETAILED DESCRIPTION

Figure 1:
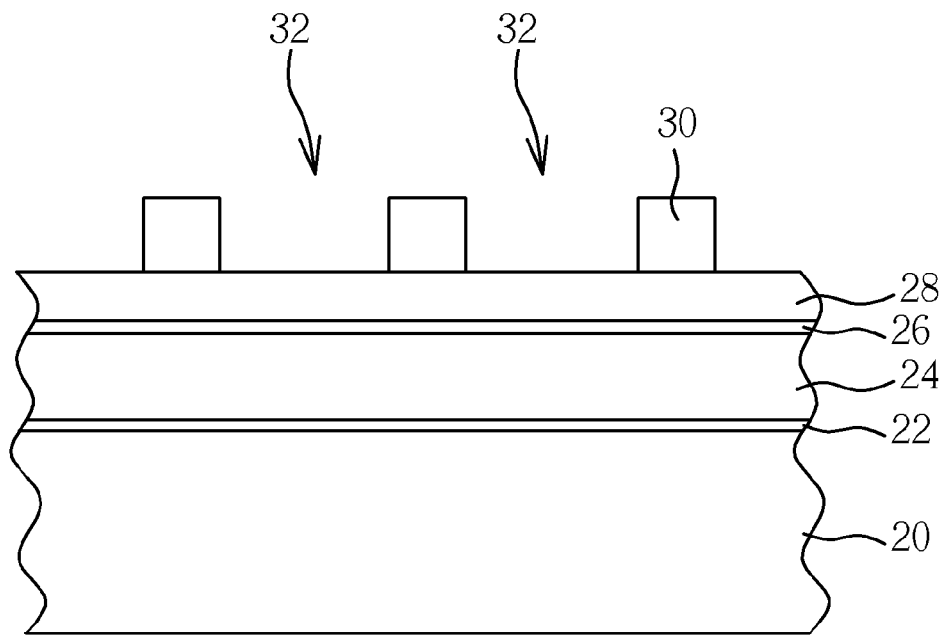
FIGS. 1-4 illustrate the processing steps in the formation of an integrated circuit device including the formation of a cap layer and the formation of a gap between conducting structures according to embodiments of the present invention.

As devices are scaled to smaller geometries, precise alignment of masking layers and precise control of etching processes are necessary to ensure proper device function and to minimize defect formation. Defects in photoresist masking layers may occur when reflections from underlying layers expose portions of the photoresist layer in an unintended manner. Unintended exposure of the photoresist etch mask can produce wiring line patterns that exhibit unacceptable levels of variation in wiring line thickness and unacceptable wiring line failure rates. In addition, conventional CVD techniques cannot adequately fill the high aspect ratio gaps between conducting structures (such as wiring lines) on a substrate surface. Conventional techniques such as PECVD tend to deposit material in a manner so that voids become enclosed within the gaps between the wiring lines. Such voids may be uncovered during subsequent processing and may indirectly result in decreased device performance.

Preferred embodiments of the present invention utilize a process for forming wiring lines using multiple masking and other layers and a two step etching process. The gaps between the wiring lines are preferably filled with a dielectric material deposited using high density plasma chemical vapor deposition (HDPCVD). HDPCVD allows for the addition of a sputter component to the dielectric deposition process, which can be controlled to promote gap-filling during deposition, achieving gap fill results superior to conventional CVD processes. The sputter component acts to remove dielectric material from areas near the top of the wiring lines which tends to then be redeposited within the gap. The multiple layers from which the wiring lines are formed may include a cap layer, a protective coating layer, a metal layer and a glue layer disposed over the substrate. The cap layer may serve a number of functions, acting as an antireflective coating, a hard mask for metal line etching, and a protector for the top corners of metal wiring lines during the HDPCVD process.

High density plasma chemical vapor deposition (HD-PCVD) systems have been developed which are capable of providing high quality dielectric layers at deposition temperatures significantly reduced from conventional CVD of dielectric layers. HDPCVD systems are commercially available (for example, from Novellus Systems, Inc.), which deposit a dielectric layer having superior density, moisture resistance and planarization properties as compared to conventional CVD dielectric layers. The high density plasma, which mediates deposition in HDPCVD systems, may be generated from a variety of sources such as electron cyclotron resonance, inductively coupled plasma, helicon, and electrostatically shielded radio frequency. All of these plasma generation mechanisms allow for the addition and independent control of a bias sputter component to the deposition process. Manipulating the relative substrate bias can alter the deposition conditions, altering the energy of the CVD precursor gases and the extent to which etching and sputtering processes occur during deposition. Control of the substrate bias makes it possible to achieve substantially void-free gap filling with enhanced planarization in an intermetal dielectric deposition process. The bias sputter component provides an etching component to the deposition process which can be controlled to remove or prevent the build-up of dielectric material deposited on the upper portions of the wiring line sidewalls during gap fill. Such a build-up is observed when other deposition methods such as PECVD are used to fill small gaps with oxides. Formation of such build-up on the sidewalls of wiring lines can lead to the inclusion of voids in the intermetal dielectric material. Eliminating such air-filled voids is desirable to reduce the impact that voids in intermetal dielectrics can have on future processing.

The bias sputtering component of HDPCVD derives from the introduction of an accelerating potential between the plasma-excited deposition gases and the deposition substrate. Such an acceleration potential may arise differently in different geometry systems. Commonly, part of the acceleration potential derives from the dc self-bias effect whereby a substrate held at a fixed potential develops a self-bias with respect to an adjacent plasma. The level of dc acceleration potential can be varied by varying the potential to which the substrate is tied. In most HDPCVD systems, an additional, independently variable rf bias is typically provided between one or more plates and the substrate. This independent rf bias allows for more complete control of the accelerating bias and the sputtering rate and helps to prevent the uneven charge build-up possible in a purely self-biased system.

The ions accelerated through the bias sputter component of HDPCVD processes etch the material present on the surface of the deposition substrate and sputter the etched material so that it is redeposited, generally on more recessed portions (i.e., farther from the ion flux) of the substrate. As an oxide is deposited onto the surface of a substrate in a HDPCVD process incorporating bias sputtering, the oxide is also etched from the surface of the substrate and sputtered into recessed portions of the substrate. Typically, the ions that are most prevalent in the bias sputtering process are relatively inert argon ions, so comparatively little of the process proceeds through chemical mechanisms and the process primarily proceeds through a physical transport mechanism. The etch rate of oxide HDPCVD processes varies as a function of the angle of incidence of the etching ions, with normally incident ions etching at a slower rate than ions that are incident at higher angles. The effect of this angular dependence of the bias sputter component of HDPCVD is that the edges of structures are etched at a faster rate than the central portions of the structures. As such, those portions of a deposited layer that are closest to a gap are the most likely to be etched and sputtered into the gap. This produces surface faceting of the HDPCVD process and the ability of the process to fill gaps effectively. It should be recognized that any plasma based process can exhibit sputter etching and deposition mechanisms. When the present inventors discuss sputtering rates in HDPCVD processes, the present inventors intend to convey a sputtering rate in comparison to a base line level of sputtering characteristic of a process such as PECVD.

Another advantage of the use of HDPCVD to deposit intermetal dielectrics is that it is generally not necessary to perform subsequent high temperature densification steps to densify the deposited dielectric material, which may sometimes be required to densify oxide layers deposited using conventional CVD and other techniques. Use of HDPCVD processes desirably reduces the number of process steps for making a device and minimizes exposure of the device to elevated temperatures.

HDPCVD processes may accomplish both deposition and etching at the same time, depending on the level of bias sputter component chosen for the deposition environment during the process. Bias sputtering removes and redistributes dielectric material from wiring line sidewalls and enables substantially void-free filling of gaps and enhances planarization. As described above, the sputter component acts to prevent material build-up at the corners of the wiring lines and results in better gap-filling. It should be noted that an excessive etching component during HDPCVD dielectric deposition may damage either wiring lines or one or more of the protective layers that might be provided over the wiring lines. Thus, the sputter component is preferably controlled or other process characteristics are adjusted to protect the wiring lines and desired portions of the intermetal dielectric. Favorable gap-filling with protection of the wiring lines can be accomplished by forming a capping layer above the wiring lines for protection and then performing an HDPCVD step to deposit material within the gaps, with the HDPCVD step preferably carried out at a high etch to deposition rate. The cap layer may be sacrificially etched during the HDPCVD processing and protects the underlying metal wiring line from undesirable etching during the dielectric deposition process. Appropriate selection of the cap material and of the shape of the cap layer formed over individual wiring lines can be used to tailor the deposition processes in addition to protecting the metal wiring lines from undesirable etching.

It should be appreciated that, while the present invention is described with reference to a particularly preferred embodiment in which the cap layer is formed and then the HDPCVD step is carried out at a high etch to deposition rate, variations on this process may be desirable. For example, the presently preferred embodiments utilize oxides for the HDPCVD layer, but it would be possible to utilize other materials if appropriate deposition techniques were available. Preferred embodiments of the present invention are now described with reference to FIGS. 1-7. FIG. 1 shows a cross-sectional view of a semiconductor substrate 20 having a number of layers deposited thereon for the formation of wiring lines. The substrate may contain a variety of elements, including, for example, transistors, diodes, and other semiconductor elements (not shown) as are well known in the art. The substrate 20 may also include other metal interconnect layers.

As seen in FIG. 1, surface layer 22 is deposited on the substrate, followed by wiring line layer 24. If portions of the surface of the substrate 20 which will make contact with the wiring lines are silicon and the wiring line layer 24 is aluminum, then surface layer 22 may comprise a material such as titanium nitride, titanium-silicide, or a titanium-tungsten alloy. Surface layer 22 acts as a barrier to prevent interactions such as interdiffusion between the silicon and the aluminum. The surface layer 22 may also help adhere the wiring line layer 24 to the substrate 20, particularly when the wiring line is formed on a dielectric layer, and may reduce electromigration tendencies in the aluminum wiring lines. The wiring line layer 24 may be formed from a variety of materials, such as aluminum, aluminum alloyed with silicon or copper, copper, alloys including copper and multilayer structures including comparatively inexpensive metals and more expensive metals such as the refractory metals. Protective layer 26 is deposited on the wiring line layer 24. Protective layer 26 may be the same material that makes up surface layer 22. The protective layer 26 serves several functions, including protecting the wiring line layer 24, limiting electromigration, providing more reproducible contacts and acting as an antireflective coating over the wiring line layer 24 and below a layer of photoresist by absorbing light transmitted during the exposure of the photoresist to light. When layer 26 is used as part of an antireflection coating on the wiring line layer 24, it is preferable that the layer 26 be highly conductive, provide stable ohmic contacts to a variety of metals, and to be absorptive at the wavelength used to expose the photoresist layer during formation of the etch mask. As such, titanium nitride is a particularly preferred material for the layer 26. The thickness of layer 26 is typically on the order of one to a few hundred angstroms. It is possible to provide a thickness for layer 26 that would cause the layer 26 to act as a quarter waveplate at the exposure wavelength. This is generally not preferred. Rather, it is preferred that the titanium nitride layer 26 be only a part of an antireflection coating for the patterning of wiring line layer 24.

Cap layer 28, which is preferably formed from silicon oxide, silicon nitride or oxynitride, is deposited over the protective layer 26. If silicon oxide is used for cap layer 28, then it is preferred that a silicon rich oxide (SRO, $SiO_{2-x}$), i.e., a silicon oxide having a greater concentration of silicon than is stoichiometric for silicon dioxide, be used to provide a harder oxide layer. Next, a layer of photoresist is provided over the cap layer 28 and the photoresist is shaped to form an etching mask 30 so that the surface of cap layer 28 is exposed at regions 32 where trenches will be formed by etching and wiring lines defined. The cap layer 28 may then be etched to complete a hard mask for etching. Alternatively, the photoresist layer itself may be used as the mask for etching layers 28, 26, 24 and 22, since this is a simpler process.

The wiring lines are formed by consecutively etching layers 28, 26, 24 and 22 from the surface of the substrate 20 in order to form gaps 36 between the wiring lines. A small portion of the substrate 20 may be etched as well. The etch processes used to remove these layers are preferable highly anisotropic and may, for example, be performed by reactive ion etching (RIE). If silicon dioxide is used for cap layer 28, then a suitable etchant may be derived from a mixture of gases that includes $CF_4$, $C_2F_6$, or $C_3F_8$. A suitable etchant for the protective layer 26, metal line layer 24 and surface layer 22 may be derived from a mixture of gases that includes HCl, $Cl_2$, or $Cl_2$ and $BCl_3$.

The cap layer 28 may serve a number of functions. During the exposure of the photoresist layer to light to shape the mask prior to etching, the cap layer may be used as a quarter wave plate in order to prevent light from passing through the cap layer and reflecting back up to the photoresist layer and causing the photoresist layer to become exposed in regions that are supposed to remain unexposed. Rather than absorbing light like the protective layer 26, the quarter wave plate creates destructive interference to prevent light from reflecting up to the photoresist layer. Those of ordinary skill in the art will appreciate that the particular thickness of layer 28 to be provided when layer 28 has its preferred function as a quarter wave plate is different for different materials. The preferred thickness for layer 28 can be determined by setting the thickness to be one quarter of the wavelength of the exposure light taking into account the dielectric constant of the material in layer 28 at the wavelength of the exposure light. More generally, the thickness may be set so that twice the thickness of the layer 28 is an odd number of half wavelengths of the exposure light, taking into account the dielectric constant of the material. It should further be appreciated that minor variations from the optimal thickness of layer 28 as a quarter wave plate will typically be effective in reducing reflectivity, although less effectively. In addition to acting as a quarter wave plate, the cap layer 28 may, depending on the material used, also act to absorb light in the same manner as the protective layer 26. The resulting antireflection structure has the further advantage of providing a graded change in the index of refraction. Reflectivity from a boundary between materials having different dielectric constants bears a complex relationship to the difference between the dielectric constants of the materials on either side of the boundary. Simplistically, however, reducing the difference between the dielectric constants of materials on either side of a boundary generally reduces the reflection from the boundary. Providing a layer of silicon oxide or silicon nitride 28, either of which has a dielectric constant closer to that of photoresist than titanium nitride, over the titanium nitride layer 26 tends to reduce the reflection from the boundary between the titanium nitride layer 26 and the photoresist layer that would be expected during the exposure process if the surface layer 28 were not present.

As noted above, the cap layer 28 may also be used as a hard mask for wiring line etching. In embodiments where the cap layer is used as a hard mask for wiring line etching, the etching is accomplished in a two step process in which the photoresist layer 30 acts as a mask during the first etch step, and the cap layer 28 acts as a mask during the second etch step. The first etch step etches through the portions of the cap layer that are not covered by the photoresist. The second etch step etches through the protective layer 26, the wiring layer 24 and the surface layer 22. By carrying out the etching process in two steps with the photoresist being removed prior to the second etching step, the likelihood of contaminants, such as carbon compounds from the photoresist layer, being deposited deep within the gaps 36 between wiring lines 34 is decreased. Alternatively, the etching can be carried out in a process in which the photoresist is used as the mask for etching all of the layers. This alternative process is faster, but runs a greater risk of contamination that could adversely affect device performance.

Figure 3:
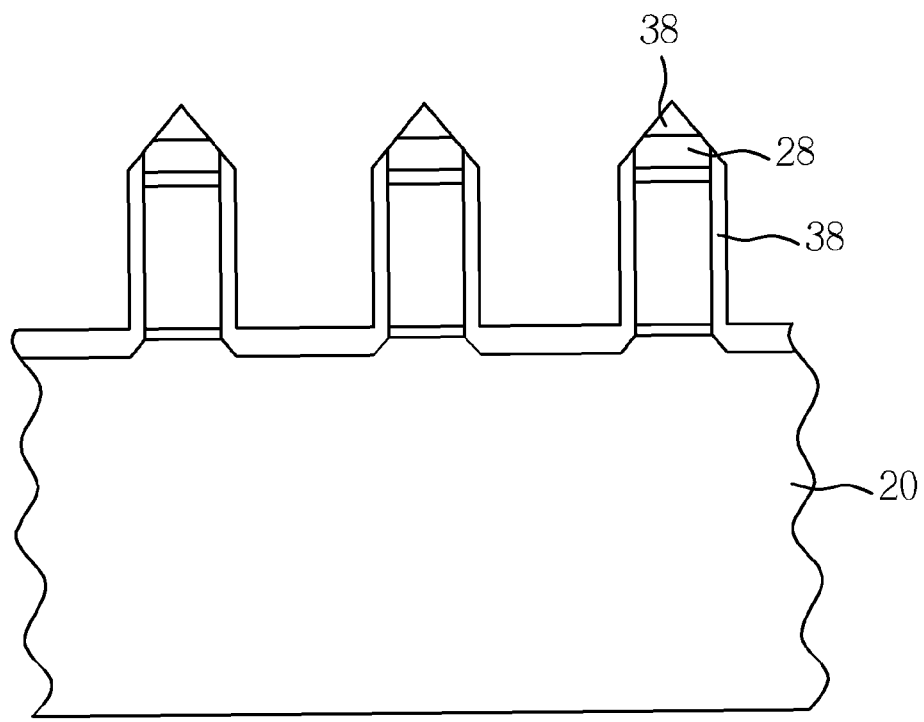

In addition, the cap layer 28 may also act as a wiring line top corner protector during subsequent HDPCVD processing, which will be discussed below. After the etching is completed and resist layer 30 is removed, the structure includes gaps 36 located between individual wiring lines 34. An HDPCVD step is then carried out to form layer 38. FIG. 3 shows an early stage of the deposition of HDPCVD layer 38, which is deposited onto the surface of the substrate 20, onto the sides of the wiring lines 34, the sides of the surface layer 22 and protective layer 26, and the sides and top of the cap layer 28. In certain preferred embodiments, the HDPCVD step is carried out at a sufficiently high etch to deposition ratio so that the high aspect ratio gaps 36 between the wiring lines will be filled with oxide material. The etching occurs because of the sputter component discussed above, which causes a portion of the cap layer 28 to being etched away along its sides and top surface. The sputter biased deposition technique is observed to produce a faceted topography on the surface of the deposited material, such as the 45° facets extending to the top of layer 38 as shown in FIG. 3.

Figure 4:
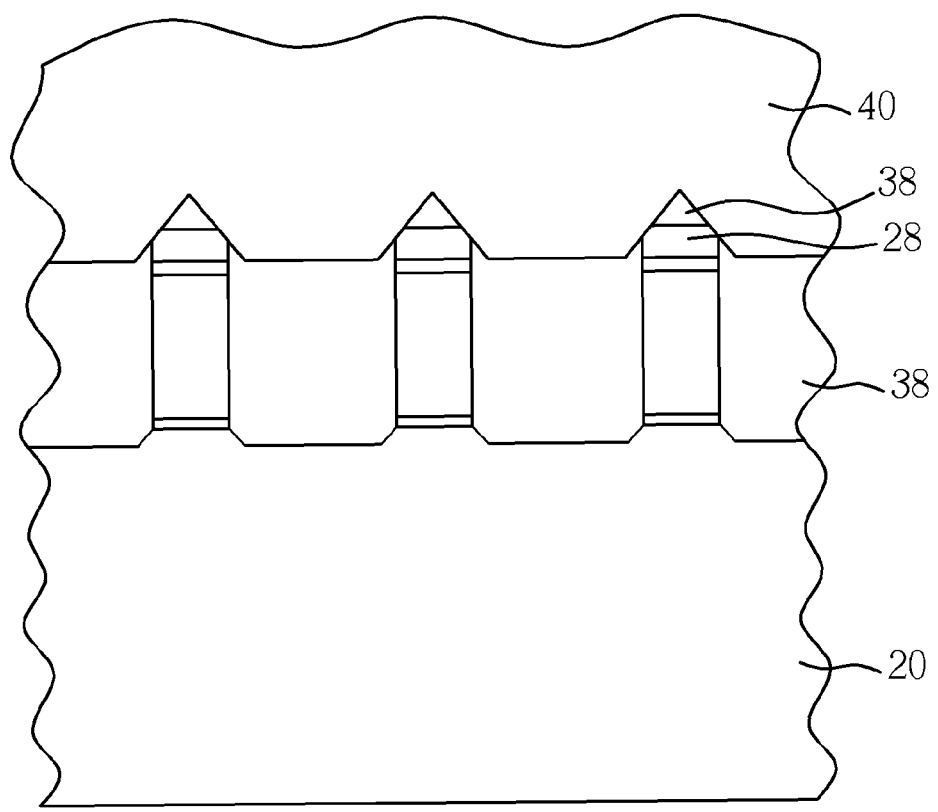

The HDPCVD of layer 38 is performed until the gap 36 is substantially filled with a material that is preferably high density oxide having essentially no voids therein. By essentially void free the inventors mean that when compared with a conventionally deposited oxide layer, the HDPCVD oxide layer will be substantially free of voids. As shown in FIG. 4, the gap may be filled to the level of the top of protective layer 26. Depending on the subsequent processing steps to be performed, the area above the deposited layer 38 may next be filled with layer 40. The layer 40 may be selected from a variety of materials and formed using a variety of techniques. Preferably, the layer 40 is a PECVD oxide layer, which may be deposited at a higher speed than is typical of present HDPCVD processes. Alternatively, the deposition of HDPCVD layer 38 may be continued so that at least a part of layer 40 is also formed in the same step. As the deposition proceeds, the HDPCVD layer tends to self-planarize. Such a self-planarized layer requires less time for chemical mechanical processing (CMP) than a layer deposited using other, conventional techniques.

Figure 2:
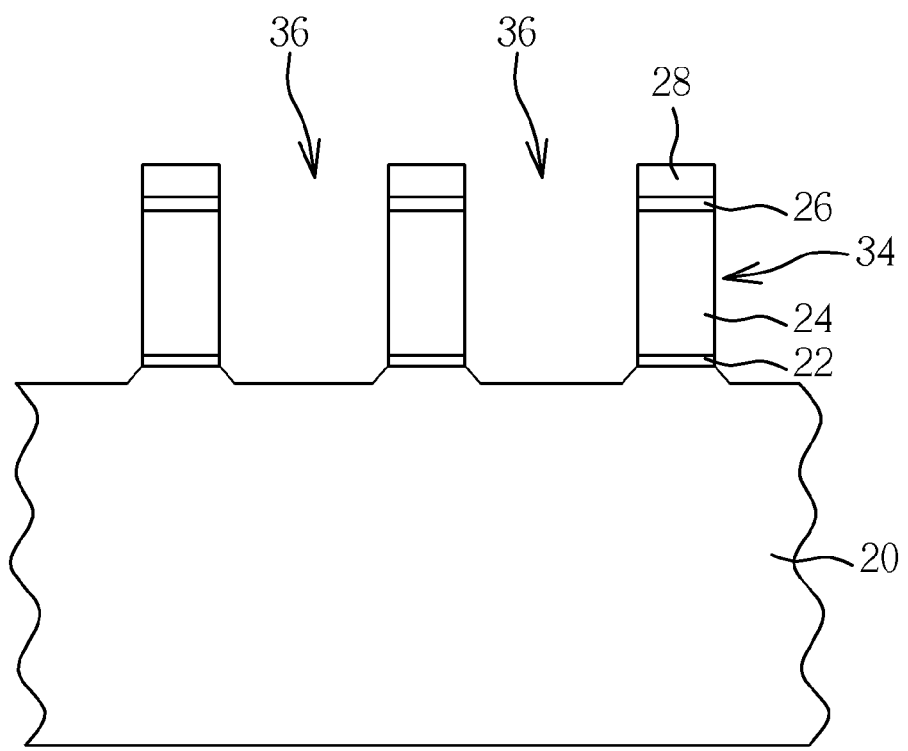
Figure 5:
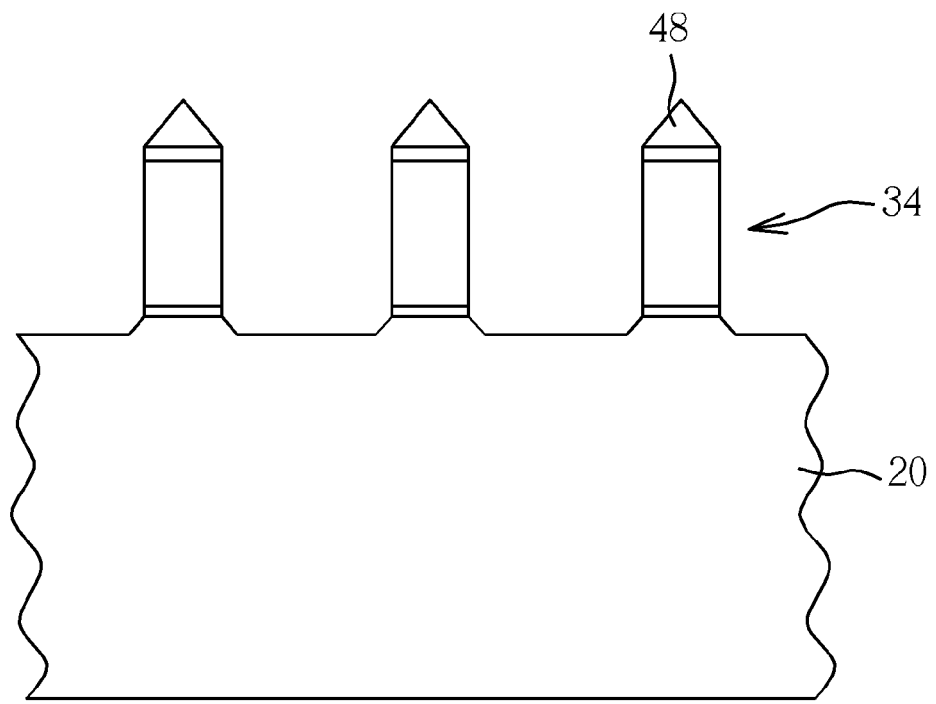
FIGS. 5-8 illustrate the formation of a cap layer according to embodiments of the present invention.
Figure 6:
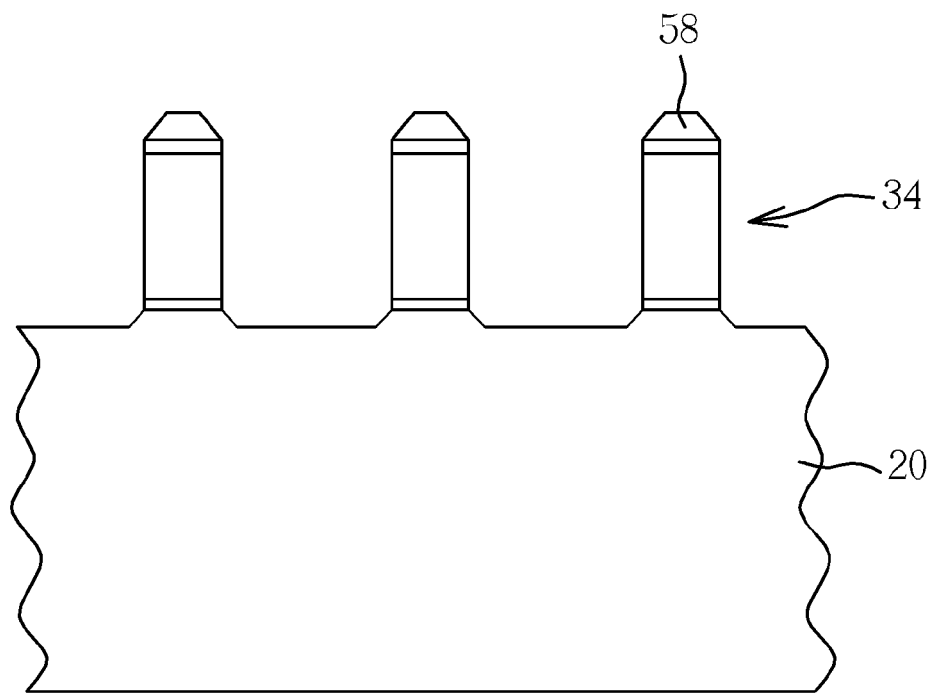
Figure 7:
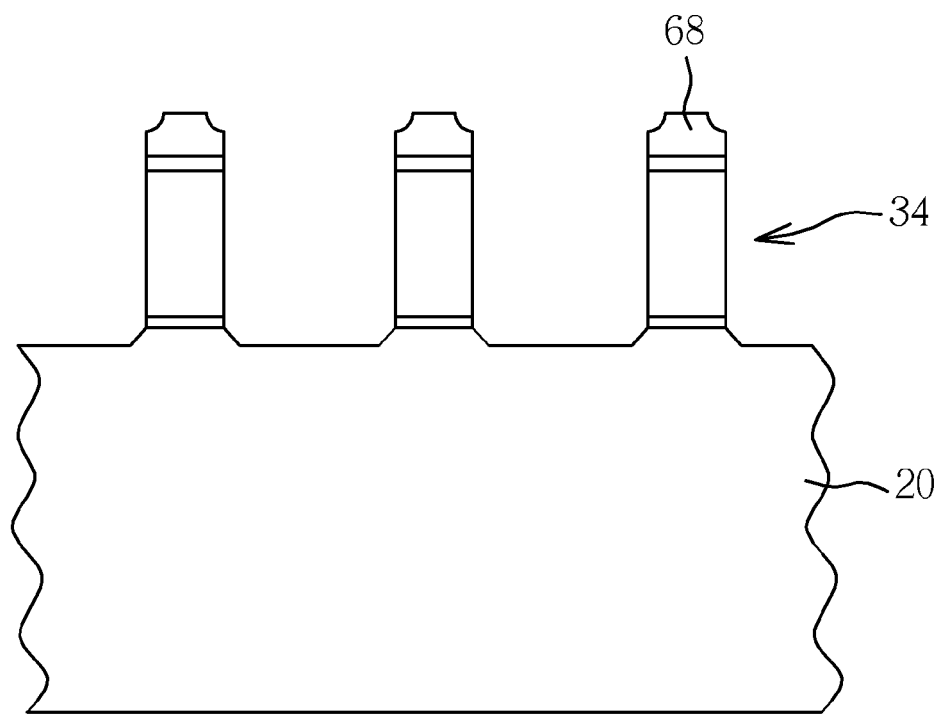
Figure 8:
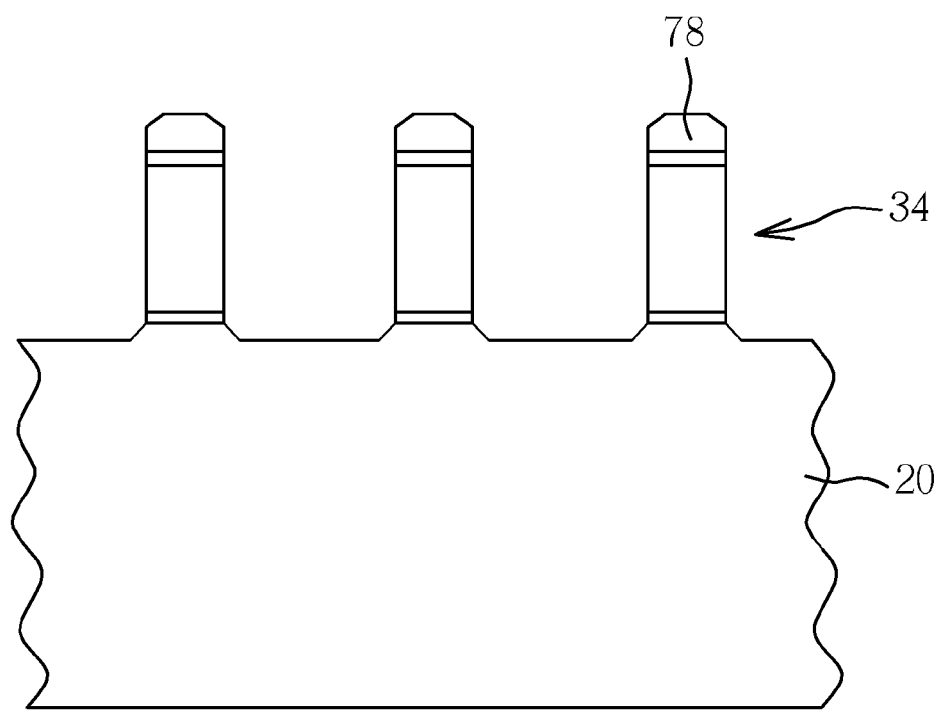

Embodiments of the present invention may also incorporate layers having shapes different from the shape of the individual cap layers 28 shown in FIG. 2, which are rectangular in cross-section. Depending on the etchants used and the position of the mask used in patterning the layer 28 into individual cap layers 28, the cap layers may have shapes such as those shown in FIGS. 5-7. FIG. 5 shows a cross-sectional view of individual cap layers 48 having a triangular shape. FIG. 6 shows a cross-sectional view of individual cap layers 58 having a four sided structure with the sides extending at an inward angle from the bottom of the cap to the top. Cap layers 58 can also be described as trapezoidal in cross-section. FIG. 7 shows a cross-sectional view of individual cap layers 68 having rectangular shapes with their upper corner regions partially etched away. The exact geometry of the etched away regions may vary depending on the etchant used in forming the structure. The upper regions of the cap layers 68 shown in FIG. 7 may be formed using an isotropic etchant. FIG. 8 shows a cross-sectional view of individual cap layers 78 having rectangular shapes with their upper corner regions partially etched away. The upper corner regions of cap layers 78 may be formed using an anisotropic etchant. Depending on the material used for the layer (and its dielectric constant, for example), it may be desirable to minimize the amount of the layer material that gets etched during the HDPCVD process and redeposited within the gap to avoid increased capacitive coupling between adjacent wiring lines mediated by the intermetal dielectric. As a result, a layer having inward facing sides may be preferable for certain embodiments. In addition, as described earlier and shown in FIGS. 3 and 4, the cap layer may have a faceted shape after the HDPCVD step. Providing the capping layer with a similar faceted shape (such as that shown in FIG. 8) prior to the HDPCVD shape may provide certain advantages in the process.

In another aspect of certain embodiments, the cap layer, which may not be a conductive material, may be removed prior to an electrical connection being made to the wiring lines.

While the present invention has been described with particular emphasis on certain preferred embodiments of the present invention, the present invention is not limited to the particular embodiments described herein. For example, electrical isolation of components other than wiring lines may be accomplished using techniques such as those set forth above. The scope of the present invention is to be determined by the following claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming wiring lines separated by gaps filled with dielectric material, comprising:
   providing a substrate;
   forming a wiring layer above the substrate;
   forming a conductive protective layer on the wiring layer;
   forming a cap layer conformally and directly on the conductive protective layer, wherein the cap layer comprising at least one material selected from the group consisting of an oxide, a nitride, and an oxynitride, and the conductive protective layer is titanium nitride;
   forming a patterned mask layer above the cap layer, said patterned mask layer covering selected portions of the cap layer and exposing other portions of the cap layer;
   etching the exposed portions of the cap layer, the conductive protective layer, and the wiring layer to form the wiring lines separated by gaps; and
   utilizing a high density plasma chemical vapor deposition to form a dielectric material within the gaps for filling the gaps.

2. The method of claim 1, wherein the cap layer comprising an oxide and an oxynitride.

3. The method of claim 1, wherein the cap layer consisting of an oxide and an oxynitride.

4. The method of claim 3, wherein the oxide is a silicon rich oxide.

5. The method of claim 1, wherein an initial stage of the layer of high density plasma chemical vapor deposition dielectric material is formed on the cap layer and covering exposed side portions of the wiring lines.

6. The method of claim 5, wherein following the initial stage the layer forming continuing at a sputtering rate sufficient to fill the gaps between the wiring lines.

7. The method of claim 1, wherein the step of etching the exposed portions of the cap layer, the conductive protective layer, and the wiring layer to form the wiring lines separated by gaps is done without removing the patterned mask layer.

8. The method of claim 1, wherein the cap layer has a trapezoidal shape in cross section after the step of etching the exposed portions of the cap layer, the conductive protective layer, and the wiring layer to form the wiring lines separated by gaps.

9. The method of claim 1, wherein the cap layer has, in cross section, a rectangular shape having its upper corners etched away after the step of etching the exposed portions of the cap layer, the conductive protective layer, and the wiring layer to form the wiring lines separated by gaps.

10. The method of claim 1, further comprising forming a surface layer between the substrate and the wiring layer, the surface layer being a barrier between the substrate and wiring layer.

11. The method of claim 1, wherein the high density plasma chemical vapor deposition uses an inductively coupled plasma, helicon or electrostatically shielded radio frequency source.

12. The method of claim 1, wherein the high density plasma chemical vapor deposition uses an inductively coupled plasma source.

* * * * *